United States Patent
van Rooyen et al.

(10) Patent No.: US 12,148,538 B2
(45) Date of Patent: Nov. 19, 2024

(54) TECHNIQUES FOR INCORPORATING SENSORS INTO APPARATUSES AND SYSTEMS

(71) Applicant: Battelle Energy Alliance, LLC, Idaho Falls, ID (US)

(72) Inventors: Isabella J. van Rooyen, Idaho Falls, ID (US); Piyush Sabharwal, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 523 days.

(21) Appl. No.: 17/089,922

(22) Filed: Nov. 5, 2020

(65) Prior Publication Data

US 2021/0134472 A1    May 6, 2021

Related U.S. Application Data

(60) Provisional application No. 62/930,865, filed on Nov. 5, 2019.

(51) Int. Cl.
| | |
|---|---|
| *B22F 10/28* | (2021.01) |
| *B33Y 10/00* | (2015.01) |
| *F28D 1/02* | (2006.01) |
| *G21C 17/10* | (2006.01) |
| *G21C 17/112* | (2006.01) |
| *H01L 23/473* | (2006.01) |

(52) U.S. Cl.
CPC ............ *G21C 17/102* (2013.01); *B22F 10/28* (2021.01); *B33Y 10/00* (2014.12); *F28D 1/02* (2013.01); *G21C 17/112* (2013.01); *H01L 23/473* (2013.01)

(58) Field of Classification Search
CPC ....................................................... B22F 10/28
See application file for complete search history.

(56) References Cited

U.S. PATENT DOCUMENTS

| | | | |
|---|---|---|---|
| 2004/0121182 A1* | 6/2004 | Hardwicke | C23C 26/02 29/889.1 |
| 2006/0018361 A1* | 1/2006 | Hardwicke | H01C 17/065 374/E7.035 |
| 2015/0315687 A1* | 11/2015 | Poole | B22F 1/08 374/102 |
| 2016/0305271 A1* | 10/2016 | Schmidt | B32B 15/14 |
| 2017/0286821 A1* | 10/2017 | Nardi | G01D 9/005 |
| 2020/0306885 A1* | 10/2020 | Bobel | B22F 10/36 |

* cited by examiner

*Primary Examiner* — Christopher S Kessler
(74) *Attorney, Agent, or Firm* — TraskBritt

(57) ABSTRACT

Methods of placing sensors in structures may involve placing first particles including a first material of the structure on or above a support surface. Second particles including a second, different material may be dispersed among the first particles at least within a transition region of the structure proximate to a location where a sensor is to be supported by the structure. A sensor may be placed in the location. The first particles of the first material may be fused to one another and to the second particles of the second material to form the structure with the sensor supported by the structure.

19 Claims, 10 Drawing Sheets

TECHNIQUES FOR INCORPORATING SENSORS INTO APPARATUSES AND SYSTEMS

CROSS-REFERENCE TO RELATED APPLICATION

This application claims the benefit under 35 U.S.C. § 119(e) of the priority date of U.S. Provisional Patent Application Ser. No. 62/930,865, filed Nov. 5, 2019, the disclosure of which is incorporated herein in its entirety by this reference.

STATEMENT REGARDING FEDERALLY SPONSORED RESEARCH OR DEVELOPMENT

This invention was made with government support under Contract Number DE-AC07-05-ID14517 awarded by the United States Department of Energy. The government has certain rights in the invention.

FIELD

This disclosure relates generally to techniques for incorporating sensors into apparatuses and systems. More specifically, disclosed embodiments relate to techniques for incorporating sensors into regions of apparatuses and systems where value measurement could be valuable, optionally utilizing additive manufacturing techniques.

BACKGROUND

In many systems, sensors attempt to monitor various operating conditions to give operators feedback about the system's status, and potentially enable automated control of the system based on feedback from the sensor. For example, heat sensors may be placed in locations near zones of interest within a system in an attempt to monitor operating conditions within those zones.

BRIEF SUMMARY

In some embodiments, methods of placing sensors in structures may involve placing first particles including a first material of the structure on or above a support surface. Second particles including a second, different material may be dispersed among the first particles at least within a transition region of the structure proximate to a location where a sensor is to be supported by the structure. A sensor may be placed in the location. The first particles of the first material may be fused to one another and to the second particles of the second material to form the structure with the sensor supported by the structure.

In other embodiments, heat exchangers may include a heat sensor directly exposed to a subject chamber of the heat exchanger. A structure of the heat exchanger may at least partially surround the heat sensor, a majority of the structure comprising a first material. A transition region of the structure located proximate to the heat sensor may include a first concentration of the first material and a second concentration of a second material. The second material may exhibit at least one material property, a value of which may fall in a range between the values for the corresponding material properties of the first material and a material of the heat sensor.

In other embodiments, fuel rods for nuclear piles may include a heat sensor exposed at an exterior of the fuel rod. A structure of the fuel rod may at least partially surround the heat sensor, a majority of the structure including a first material. A transition region of the structure located proximate to the heat sensor may include a first concentration of the first material and a second concentration of a second material. The second material may exhibit at least one material property, a value of which may fall in a range between the values for the corresponding material properties of the first material and a material of the heat sensor.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings. In the drawings:

DETAILED DESCRIPTION

Figure 1:
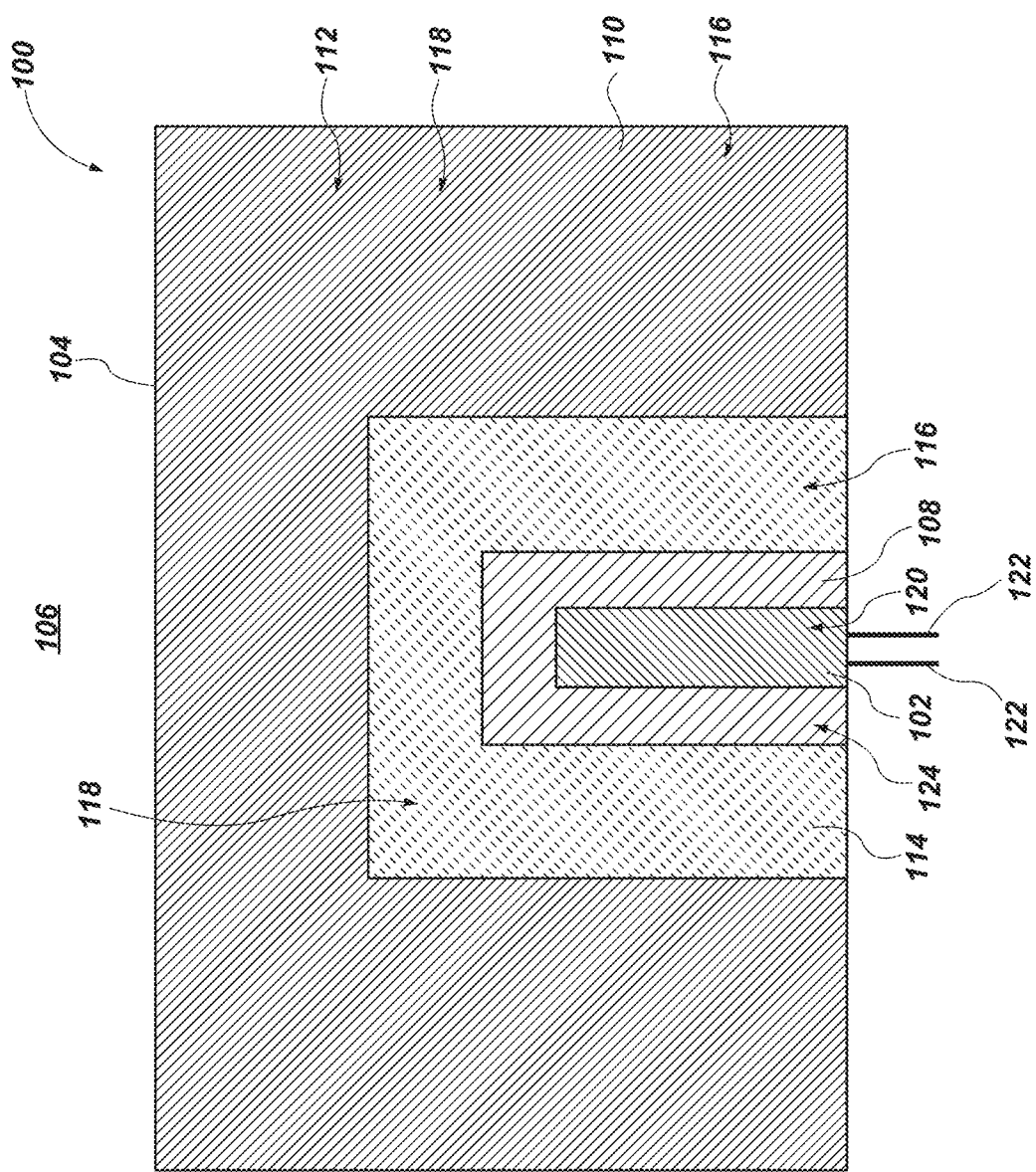
FIG. 1 is a cross-sectional side view of a schematic of a structure supporting a sensor in accordance with this disclosure.

The illustrations presented in this disclosure are not meant to be actual views of any particular system, sensor, or component thereof, but are merely idealized representations employed to describe illustrative embodiments. Thus, the drawings are not necessarily to scale.

Disclosed embodiments relate generally to techniques for incorporating sensors into regions of apparatuses and systems where value measurement could be valuable, optionally utilizing additive manufacturing techniques. More specifically, disclosed are embodiments of apparatuses and systems including structures of different materials than the sensors, techniques for alleviating differences in material properties between the materials of the sensors, structures, and component(s) affixed thereto, and techniques for forming the sensors, structures, and/or component(s) enabling such material selections and relative positioning for the materials.

Certain systems and components of systems are difficult to monitor because of their operating environments. For example, systems generating energy from nuclear radiation and components thereof may be difficult to monitor effectively because of exposure to nuclear radiation, corrosive materials, and high operating temperatures. It can be particularly difficult to monitor operational characteristics within or close to the operating environment and at surfaces of systems and components exposed to the operating environment. Introducing sensors into these kinds of regions utilizing conventional techniques may introduce points of weakness at the interface between the sensor and the component to which the sensor is attached, may compromise the performance of the component at and around the location where the sensor is located, and may compromise performance of the system due to interaction between the sensor and the operating environment.

To address these and other issues, sensors in accordance with embodiments of this disclosure may be incorporated into a structure formed from a different material than the sensors. A first material of the structure may be, for example, an insulating material (relative to temperature, electrical current, or both) compared to a material of the sensor. In some embodiments, the first material of the structure may include, for example, particles or regions of a second material having at least one value for a material property falling in a range between the corresponding values for material properties of the sensor and the structure dispersed within at least a portion of the first material of the structure. In some embodiments, the first material of the structure may include, for example, particles or regions of another material configured to absorb fission products and/or corrosive materials among the first material of the structure.

In some embodiments, the structure may include a transition region located proximate to the sensor. The transition region may include, for example, a gradient in respective concentrations (e.g., densities) of the material of the sensor and the first material of the structure, or at least between values of material properties of the material of the sensor and the first material of the structure. To achieve such a gradient, the transition region may include varying quantities of the first material and the second material of the structure relative to distance from the sensor.

To enable formation of structures with sensors at locations of interest, and optional formation of sensors in situ in the structures, the sensor, the structure, or both may be formed utilizing additive manufacturing techniques. For example, the sensor, the structure, or both may be formed by sequential positioning of particles of material of the sensor, the structure, or both, followed by consolidation and fusing of the particles to form the sensor, the structure, or both. More specifically, the structure, the sensor, or both may be formed by sequential, layered deposition of first particles comprising a first material of the structure, second particles of a second material of the structure, optionally third particles comprising a third, protective material of the structure, and optionally fourth particles comprising a fourth material of the sensor, followed by application of heat and optionally pressure to sinter the particles and form the sensor, the structure, or both. In other embodiments, one of the sensor or the structure may be supplied as a pre-formed, complete part, and the other of the sensor or the structure may be formed proximate to (e.g., around, within) the pre-formed, complete part utilizing additive manufacturing techniques.

Desirable properties that the second particles of the second material may provide between the properties of the first material of the structure and the fourth material of the sensor may include, for example, coefficient of thermal expansion, corrosion-resistance, radiation absorption, and/or other material properties.

In some embodiments, one or more of the first particles of the structure, the second, transitional particles of the structure, the third, protective particles of the structure, and the fourth particles of the sensor may include a core particle and a casing of another material at least partially surrounding the core particle. For example, the first particles may include core particles of the first material and a casing of the second material, the third material, the fourth material, or a combination thereof at least partially surrounding the core particle of the first material. As another example, the second particles may include core particles of the second material and a casing of the first material, the third material, the fourth material, or a combination thereof at least partially surrounding the core particle of the second material. As another example, the third particles may include core particles of the third material and a casing of the first material, the second material, the fourth material, or a combination thereof at least partially surrounding the core particle of the third material. As yet another example, the fourth particles may include core particles of the fourth material and a casing of the first material, the second material, the third material, or a combination thereof at least partially surrounding the core particle of the fourth material.

In some embodiments, particles of the first material of the structure, the second material of the structure, the optional third material of the structure, and/or the optional fourth material of the sensor may be dispersed among, and interspersed with the particles of another of the first material, the second material, the third material, and/or the fourth material. For example, one or more of the second particles of the second material, the third particles of the third material, and/or the fourth particles of the fourth material may be dispersed among, and interspersed with, the first particles of the first material within the structure. As another example, one or more of the first particles of the first material, the second particle of the second material, and/or the third particles of the third material may be dispersed among, and interspersed with, the fourth particles of the fourth material within the sensor. As another example, one or more of the first particles of the first material, the second particles of the second material, and/or the fourth particles of the fourth material may be dispersed among, and interspersed with, the third particles of the third material within a housing interpose between the sensor and the structure.

Particle sizes of the first particles of the structure, the second particles of the structure, the optional third particles of the structure, and the optional fourth particles of the sensor may be controlled to achieve a desired likelihood of attachment between adjacent structures, a desired packing density pre-consolidation, and/or a desired degree of intermixing of materials. For example, an average particle size of one or more of the first particles, second particles, third particles, and/or fourth particles may be in the nanoscale range or the microscale range. More specifically, the average particle size of one or more of the first particles, second particles, third particles, and/or fourth particles may be different from the average particle size of another or more of the first particles, second particles, third particles, and/or fourth particles. As a specific, nonlimiting example, a majority of the particles positioned to form the structure, the sensor, or both may be in the microscale range, and a minority of the particles, which may be dispersed among, and interspersed with, the other particles may be in the nanoscale range.

Applications where sensors and structures supporting sensors in accordance with this disclosure may be of particular value may include, for example, the aerospace, energy, and chemical industries. More specifically, sensors in accordance with embodiments of this disclosure may be incorporated into, for example, the structures of heat exchangers, fuel rods, or other components exposed to nuclear energy, corrosive materials, and/or high operating temperatures. Such a configuration may enable more direct detection of the operating environment and components exposed to the operating environment in such applications, whereas conventional techniques may generally involve detecting a region distanced from the operating environment and relying on theoretical models to extrapolate or infer the situation in the operating environment and/or the component(s) exposed to the operating environment.

As one specific example of an application for embodiments of this disclosure, additive manufacturing techniques may be used to incorporate sensors into advanced compact heat exchangers. Nuclear energy programs utilizing in-pile instrumentation and characterization capabilities enabled by additive manufacturing techniques in accordance with embodiments of this disclosure may enable better understanding the performance of nuclear fuels and materials in high-radiation environments, as another specific illustrative application. To correlate material performance with evolving microstructure, accurate temperature measurements with time and location resolution enabled by embodiments of this disclosure may provide particular advantages. Such advantages can also be applied to any systems providing integration between heat source and heat sink and may be useful for overall system performance and efficiency. Sensors embedded during fabrication may also increase the longevity of the supporting heat exchanges, provide more data without disrupting flow, and provide better system control.

Advanced control over material properties at the interface between an embedded sensor and a supporting structure may be enable development of gradients (or functionally graded materials) to enable sensors to be embedded in both ceramic and metallic components. The sensors or the encasement of sensors (e.g., using a housing as described in greater detail below) may be fabricated by additive manufacturing, which can be an integrated process where the component as well as the sensor can be fabricated contemporaneously.

Embedding sensors during fabrication may enhance the adoption of advanced heat exchangers due to the potential of increased achievable data during testing and operation of the heat exchangers. Improved data regarding, and control over, actual performance may increase the longevity of the heat exchanger and provide better control for the system overall. Data gathered from embedded sensors may enable improvement in design and operations, which could further improve existing correlations.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even 100% the specified value.

As used herein, the term "microscale" refers to particles having an average diameter from about 1 μm to about 999 μm. As used herein, the term "nanoscale" refers to particles having an average diameter from about 1 nanometer to about 999 nanometers. Use of the term "diameter" in connection with particle size refers to the average height, average width, average depth, or other surface-to-surface dimension regardless of particle shape, and may not necessarily be used to limit the particles described herein to spherical shapes.

The term "sintering," as used herein, means temperature-driven mass transport, which may include densification and/or coarsening of a particulate component, and typically involves removal of at least a portion of the pores between the starting particles (accompanied by shrinkage) combined with coalescence and bonding between adjacent particles.

The term "green," as used herein, means an unsintered structure comprising a plurality of discrete particles, which may be held together by a binder material, the unsintered structure having a size and shape allowing the formation of a part or component suitable for use in intended applications, typically involving subsequent manufacturing processes including, but not limited to, machining and densification.

FIG. 1 is a cross-sectional side view of a schematic of a structure 100 supporting a sensor 102 in accordance with embodiments of this disclosure. The structure 100 may be configured as, for example, a heat exchanger or a fuel rod, and may have an outer surface 104 exposed to a subject chamber 106, such as, for example, an operating chamber of a nuclear reactor, a cooling fluid chamber of a nuclear reactor, a subject fluid or cooling fluid chamber of a heat exchanger, or other structure where placement of a sensor proximate to, or exposed at, a relevant location may be desired. In some embodiments, the sensor 102 may be exposed at the outer surface 104 of the structure 100 to the subject chamber 106, such as in a direction perpendicular to the plane of the cross-section shown in FIG. 1. In other embodiments, the sensor 102 may be shielded from the subject chamber 106 by a portion of an associated housing 108, a portion of the structure 100 itself, or both. In some such embodiments, the sensor 102 may be located closer to the subject chamber 106 than was previously possible utilizing conventional approaches. This closer position may be at least in part because of the location of the sensor 102 supported by (e.g., embedded within) the structure 100, as enabled by the techniques disclosed herein.

The structure 100 may include a first region 110 including a first material 112. For example, a majority of a body of the structure 100 may be primarily composed of the first material 112. More specifically, a majority of the first region 110 of the structure 100 may be formed from the first material 112, and the first region 110 may optionally include a quantity of one or more of a second material 116, a third material 118, and/or a fourth material 120. A value of at least one material property of the first material 112 may be intermediate to the values of the corresponding properties of the first material 112 and a fourth material 120 of the sensor 102. In embodiments where the first region 110 includes the third material 118, the third material 118 may be configured as a protective material to absorb or mitigate the effects of radiation and/or corrosion, and/or the fourth material 120 of the sensor 102. As a specific, nonlimiting example, between about 75% and about 100% of the first region 110 by weight may be composed of the first material 112, and any remainder of the first region 110 may include at least substantially randomly distributed microscale or nanoscale particles of the second material 116, third material 118, and/or fourth material 120. In some embodiments, the first material 112 may be, for example, a metal, metal alloy, or ceramic material. More specifically, the first material 112 may include, for example, uranium dioxide, zirconium alloy, steel, aluminum, aluminum alloy, copper, copper alloy, other metals, metal alloys, or ceramic materials.

The structure 100 may further include a second region 114 (also characterized as a "transition" region 114 herein) interposed between the first region 110 and the sensor 102. The transition region 114 may include a second material 116 different from the first material 112. More specifically, the transition region 114 may include the second material 116 different from the first material 112 and either different from, or the same as, the fourth material 120 of the sensor 102. As a specific, nonlimiting example, the transition region 114 may include the second material 116, as well as the first material 112 of the structure 100, optionally the third material 118 configured to absorb or mitigate the effects of radiation and/or corrosion, and/or optionally the fourth material 120 of the sensor 102.

In some embodiments, the transition region 114 may include a first amount (e.g., a first quantity, a first concentration, a first density) of the first material 112 and a second amount (e.g., a second quantity, a second concentration, a second density) of the second material 116. For example, the respective first concentration of the first material 112 and the second concentration of the second material 116, and optionally the distributions of the first material 112 and the second material 116 within the transition region 114, may be in amounts, positions, and configurations to mitigate differences (e.g., mismatches) in one or more material properties between the first region 110 and the sensor 102. More specifically, the transition region 114 may include, for example, a gradient from a first, highest concentration of the first material 112 and a second, lowest concentration of the second material 116 proximate to the first region 110 to a first, lowest concentration of the first material 112 and a second, highest concentration of the second material 116 proximate to the sensor 102. As another more specific example, the transition region 114 may include an at least substantially constant relative first concentration of the first material 112 and second concentration of the second material 116, with particles of the first material 112 and the second material 116 at least substantially randomly and homogeneously distributed amongst one another.

The second material 116 may include, for example, a metal, metal alloy, or ceramic material. More specifically, the second material 116 may include, for example, depleted uranium, depleted thorium, barium sulfate, a metal oxide, steel, aluminum, aluminum alloy, copper, copper alloy, chrome, chrome alloy, lead, lead alloy, other metals, metal alloys, or ceramic materials.

The third material 118 optionally included in the first region 110 and/or the transition region 114 may be configured to absorb or mitigate the effects of radiation and/or corrosion. For example, the third material 118 may include depleted uranium, depleted thorium, barium sulfate, a metal oxide, steel, aluminum, aluminum alloy, copper, copper alloy, chrome, chrome alloy, lead, lead alloy, other metals, metal alloys, or ceramic materials. In some embodiments, the third material 118 may be provided in a gradient from a highest concentration proximate to the outer surface 104 exposed to the subject chamber 106 to a lowest concentration distal from the outer surface 104 exposed to the subject chamber 106. In other embodiments, the third materials 118 may be detectable in an at least substantially constant concentration throughout the respective first region 110, transition regions 114, or both distributed at least substantially randomly and homogeneously amongst the other material or materials of the first region 110, transition region 114, or both.

In some embodiments, the sensor 102 may be located at least partially within a housing 108, with the housing 108 interposed between at least a portion of the sensor 102 and at least a corresponding portion of the structure 100. For example, the housing 108 may be located between at least one side of the sensor 102 and at least one corresponding side of the structure 100. More specifically, the housing 108 may cover a majority of the sides of the sensor 102, as shown in FIG. 1. As a specific, nonlimiting example, the housing 108 may overlie all but one side from which terminals 122 of the sensor 102 extend or all but the side from which terminals 122 of the sensor 102 extend and a side exposed at an outer surface 104 of the structure 100 (e.g., in a direction perpendicular to the plane of the cross-section shown in FIG. 1).

The housing 108 may include a fifth material 124 configured to protect the sensor 102 from radiation and/or corrosion that would otherwise result from exposure to the subject chamber 106. For example, the housing 108 may include a metal, metal alloy, or ceramic material. More specifically, the fifth material 124 may include, for example, depleted uranium, depleted thorium, barium sulfate, a metal oxide, steel, aluminum, aluminum alloy, copper, copper alloy, chrome, chrome alloy, lead, lead alloy, other metals, metal alloys, or ceramic materials.

The sensor 102 may be configured to generate a signal indicative of one or more operating conditions extant in the subject chamber 106 or in the material of the structure 100 itself. For example, the sensor 102 may be configured as a thermocouple configured to generate a signal indicative of a temperature in the subject chamber 106 or of the structure 100 itself, a radiation sensor configured to generate a signal indicative of an intensity of radiation in the subject chamber 106 or of the structure 100 itself, a pressure sensor configured to generate a signal indicative of a pressure in the subject chamber 106, a gas or chemical sensor configured to generate a signal indicative of the presence of a specific gas or chemical in the subject chamber 106, or a flow sensor configured to generate a signal indicative of a rate of flow of a fluid in the subject chamber 106. In some embodiments, the terminals 122 of the sensor 102 may be exposed at one outer surface 104 of the structure 100 (e.g., an outer surface 104 not exposed to the subject chamber 106) to enable routing associated cables to an associated receiver. In other embodiments, the terminals 122 may be located within the body of the structure 100, and associated cable routing may pass through the body of the structure 100 (e.g., through at least the first region 110, optionally through the housing 108, optionally through the transition region 114).

In some embodiments, at least a portion of each of the first region 110, the transition region 114, the housing 108, and the sensor 102 may be exposed at the outer surface 104 of the structure 100. Exposing a portion of the sensor 102 at the outer surface 104 may enable the signal generated by the sensor 102 to better reflect actual operating conditions in the subject chamber 106. To facilitate such a configuration, a portion of the first region 110 and a portion of the transition region 114 of the structure 100 may also be exposed at the outer surface 104, as well as a portion of the housing 108. In other embodiments, at least the sensor 102, and optionally the housing 108 and/or the transition region 114, may be embedded within the first region 110, such that the sensor 102 may not be directly exposed at the outer surface 104 of the structure 100.

Figure 2:
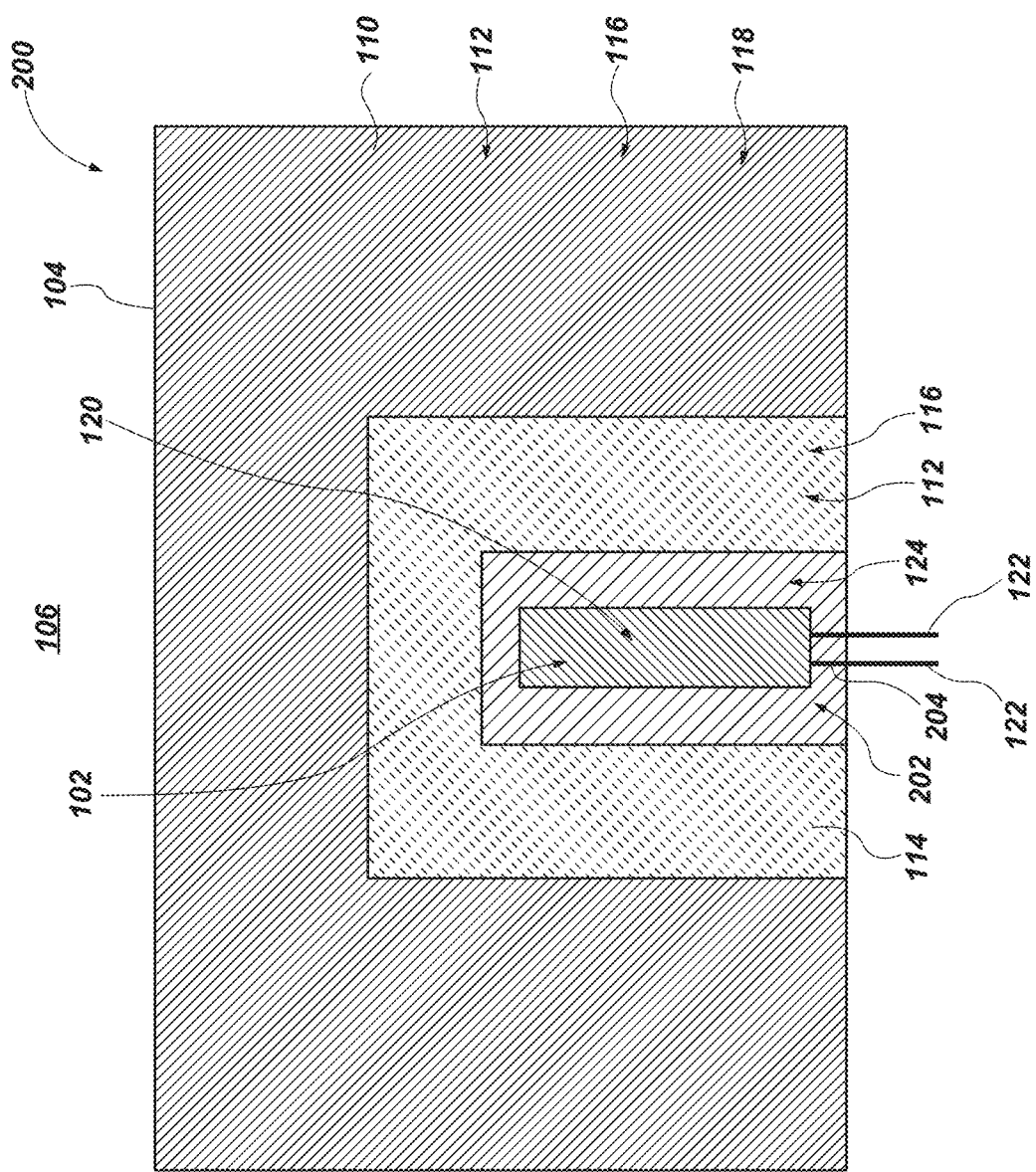
FIG. 2 is a cross-sectional side view of a schematic of another embodiment of structure supporting a sensor in accordance with this disclosure.

FIG. 2 is a cross-sectional side view of a schematic of another embodiment of structure 100 supporting a sensor 102 in accordance with this disclosure. As with the structure 100 of FIG. 1, the structure 200 of FIG. 2 may be configured as, for example, a heat exchanger or a fuel rod, and may have an outer surface 104 exposed to a subject chamber 106, such as, for example, an operating chamber of a nuclear reactor, a cooling fluid chamber of a nuclear reactor, a subject fluid or cooling fluid chamber of a heat exchanger, or other structure where placement of a sensor proximate to, or exposed at, a relevant location may be desired. In some embodiments, the sensor 102 may be spaced from the subject chamber 106 by at least a portion of the housing 202. For example, the housing 202 may at least substantially entirely surround the sensor 102, and shield a majority of the sensor 102 from exposure to the subject chamber 106. More specifically, the housing 202 may cover all but one of the sides of the sensor 102, a portion of the remaining side of the sensor 102 may be covered by the housing 202, and a remainder of the remaining side of the sensor 102 may be exposed to a conduit 204 enabling connection to the terminals 122 of the sensor 102 through the housing 108. In some embodiments, the conduit 204 may further extend through a portion of the transition region 114, a portion of the first region 110, or both.

In some such embodiments, such as that shown in FIG. 2, a portion of the housing 202 and a portion of the transition region 114 may be exposed at the outer surface 104 of the structure 200. For example, the first region 110 of the structure 200, the transition region 114 of the structure 200, and a portion of the housing 202 may be exposed at the outer surface 104 of the structure 200. Continuing the example, the sensor 102 may be shielded from direct exposure to the subject chamber 106 at least by a portion of the housing 202 and, in some embodiments, by a portion of the transition region 114, a portion of the first region 110, or both.

Figure 3:
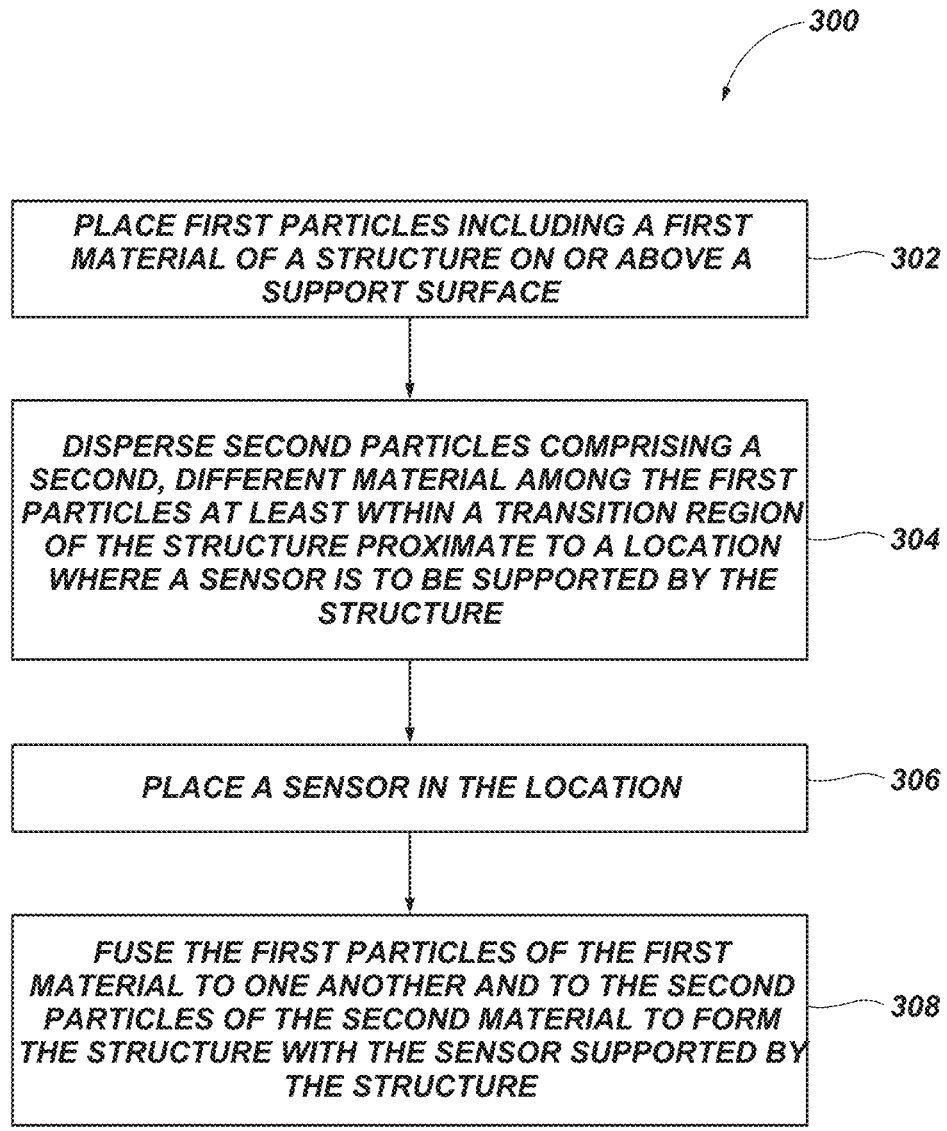
FIG. 3 is a flowchart of a method of making a structure supporting a sensor in accordance with this disclosure.
Figure 4:
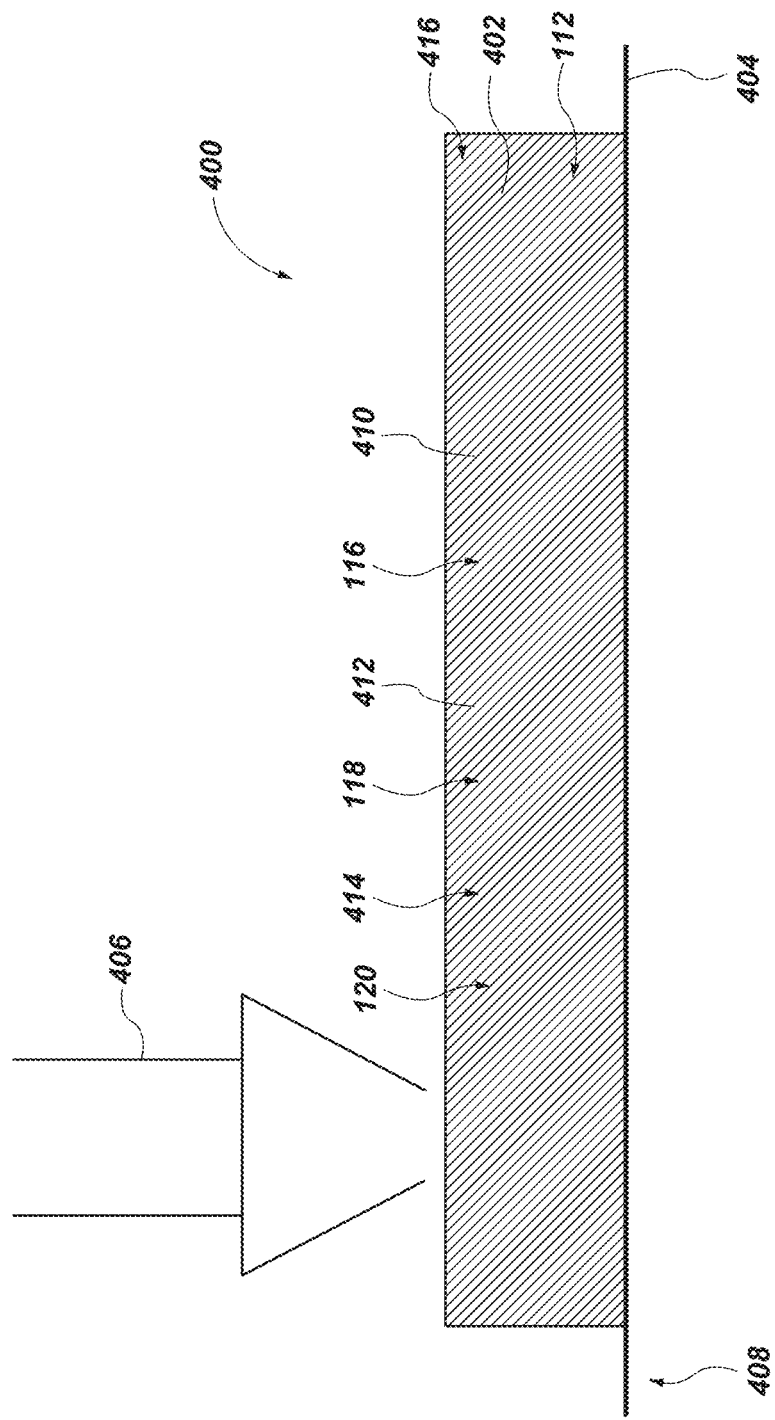
FIG. 4 is a partial cross-sectional side view of a schematic of a first intermediate product in a first stage of the method of FIG. 3.

FIG. 3 is a flowchart of a method 300 of making a structure supporting a sensor in accordance with this disclosure. FIG. 4 is a partial cross-sectional side view of a schematic of a first intermediate product 400 in a first stage of the method of FIG. 3. With combined reference to FIG. 3 and FIG. 4, the method 300 may involve placing first particles 402 including a first material 112 of a structure on or above a support surface 404, as indicated at act 302. For example, a 3D-printer 406 may be used to place first particles 402 of the first material 112 on a support surface 404 of a platform 408 of the 3D-printer 406. As a specific, nonlimiting example, the 3D-printer 406 may dispense the first particles 402 of the first material 112, as a powder or optionally suspended in a slurry or paste to enable easier dispensation, in sequential passes over the support surface 404 of the platform 408 to build up a first region 416 of the first intermediate product 400 as a precursor to forming the first region 110 (see FIG. 1) of the resulting structure 100 (see FIG. 1). In some embodiments where the first particles 402 (or any other particles disclosed herein) are dispensed as a powder, heat may be applied to the powder at, or close to, the dispensation location (in terms of both timing and position) to at least partially fuse the first particles 402 to one another. This application of heat may be accomplished, for example, by directing a laser at the dispensed powder.

The first particles 402 of the first material 112 may represent a majority by weight of the slurry or paste output from the 3D-printer 406, at least insofar as the first intermediate product 400 is concerned. For example, the first intermediate product 400 may be configured to form a portion of the first region 416 of the first intermediate product 400, and the first particles 402 of the first material 112 may form about 51% by weight or more of the slurry or paste dispensed to form the first intermediate product 400. More specifically, the first particles 402 of the first material 112 may form between about 60% and about 99% (e.g., about 70%, about 75%, about 80%, about 90%, about 95%) by weight of the slurry or paste dispensed to form the first intermediate product 400.

In some embodiments, placing the first particles 402 including the first material 112 may also involve placing second particles 410 including a second material 116 on or above the support surface 404. For example, the 3D-printer 406 may dispense a slurry or paste including the second particles 410 including the second material 116 having a value for at least one property intermediate the values for the corresponding material property of the first material 112 and a fourth material 120 of a sensor 102 (see FIG. 1) to be supported by the first region 416 of the first intermediate product 400 interspersed with the first particles 402 including the first material 112. Such a slurry may primarily include the first particles 402 of the first material 112, and the second particles 410 of the second material 116 may represent about 25% or less by weight (e.g., between about 1% and about 10% by weight) of the slurry or paste.

In some embodiments, placing the first particles 402 including the first material 112 may also involve placing third particles 412 including a third material 118 on or above the support surface 404. For example, the 3D-printer 406 may dispense a slurry or paste including the third particles 412 including the third material 118 configured to mitigate the effects of radiation and/or corrosion interspersed with the first particles 402 including the first material 112. Such a slurry may primarily include the first particles 402 of the first material 112, and the third particles 412 of the third material 118 may represent about 25% or less by weight (e.g., between about 1% and about 10% by weight) of the slurry or paste.

In some embodiments, placing the first particles 402 including the first material 112 may also involve placing fourth particles 414 including a fourth material 120 on or above the support surface 404. For example, the 3D-printer 406 may dispense a slurry or paste including the fourth particles 414 including the fourth material 120 of the sensor 102 (see FIG. 1) to be supported by the first region 416 of the first intermediate product 400 interspersed with the first particles 402 including the first material 112. Such a slurry may primarily include the first particles 402 of the first material 112, and the fourth particles 414 of the fourth material 120 may represent about 25% or less by weight (e.g., between about 1% and about 10% by weight) of the slurry or paste.

Each of the first particles 402, second particles 410, third particles 412, and fourth particles 414 may include nanoscale, microscale, or a mixture of nanoscale and microscale particles. For example, the first particles 402 may be microscale particles, and any second particles 410, third particles 412, and fourth particles 414 dispersed among the first particles 402 may be nanoscale particles. As another example, the first particles 402 may have a multimodal (e.g., bimodal, trimodal, etc.) particle size distribution. Continuing the other example, each of the second particles 410, third particles 412, and fourth particles 414, if any such particles are included in the first intermediate product 400, may have a multimodal (e.g., bimodal, trimodal, etc.) particle size distribution.

Each of the first particles 402, second particles 410, third particles 412, and fourth particles 414 may include additional materials, such as, for example, in the form of coatings. For example, the first particles 402 including the first material 112 may include a coating of the second material 116, third material 118, fourth material 120, or any combination of these. As another example, the second particles 410 including the second material 116 may be coated with a coating of the first material 112, third material 118, fourth material 120, or any combination of these. As yet another example, the third particles 412 including the third material 118 may be coated with a coating of the first material 112, second material 116, fourth material 120, or any combination of these. As still another example, the fourth particles 414 including the fourth material 120 may be coated with a coating of the first material 112, second material 116, third material 118, or any combination of these.

Figure 5:
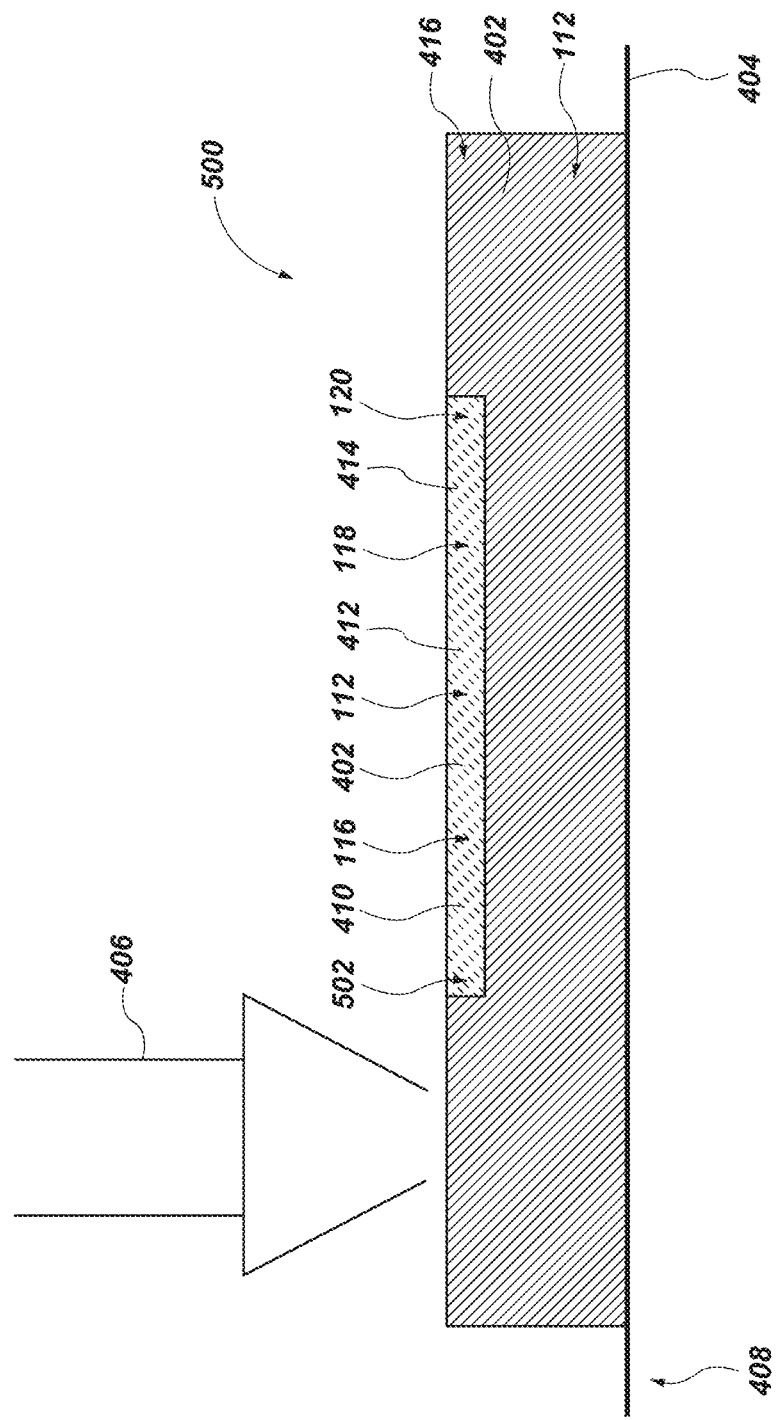
FIG. 5 is a partial cross-sectional side view of a schematic of a second intermediate product in a second stage of the method of FIG. 3.

FIG. 5 is a partial cross-sectional side view of a schematic of a second intermediate product 500 in a second stage of the method 300 of FIG. 3. FIG. 5 omits the second particles 410, third particles 412, and fourth particles 414 from the first region 416 for the sake of simplicity and convenience in depiction. Such omission does not mean that such optional materials are lacking from the particles and materials combined with the first particles 402 of the first material 112 to form the first region 416, or that an embodiment wholly separate from that of FIG. 4 is depicted in FIG. 5.

With combined reference to FIG. 3 and FIG. 5, the method 300 may involve dispersing second particles 410 including the second material 116 among the first particles 402 at least within a transition region 114 proximate to a location where a sensor 102 (see FIG. 1) is to be supported by the resulting structure 100 (see FIG. 1), as indicated at act 304. For example, the 3D-printer 406 may be used to place second particles 410 of the second material 116 on or above the support surface 404 of the platform 408 of the 3D-printer 406. The second particles 410 of the second material 116 may be deposited on the first material 112 including the first particles 402. As a specific, nonlimiting example, the 3D-printer 406 may dispense the second particles 410 of the second material 116, optionally suspended in a slurry or paste to enable easier dispensation, in sequential passes over portions of the support surface 404 of the platform 408 to build up the transition region 502 of the second intermediate product 500 on the first material 112 including the first particles 402 as a precursor to forming the transition region 114 (see FIG. 1) of the resulting structure 100 (see FIG. 1).

The second particles 410 including the second material 116 may represent a minority or a majority by weight of the slurry or paste output from the 3D-printer 406, at least insofar as the transition region 502 the second intermediate product 500 is concerned. For example, the transition region 502 of the second intermediate product 500 may be configured to form a portion of the transition region 502 of the second intermediate product 500, and the second particles 410 of the second material 116 may form between about 15% and about 85% by weight of that portion of the slurry or paste dispensed to form the transition region 502 of the second intermediate product 500. More specifically, the second particles 410 of the second material 116 may form between about 25% and about 75% (e.g., about 40%, about 50%, about 60%) by weight of the slurry or paste dispensed to form the transition region 502 of the first second intermediate product 500.

Placing the second particles 410 including the second material 116 may also involve placing first particles 402 including the first material 112 on or above the support surface 404. For example, the 3D-printer 406 may dispense a slurry or paste including the first particles 402 including the first material 112 interspersed with the second particles 410 including the second material 116 to form the transition region 502 adjacent to the first region 416. Such a slurry may include lower concentrations, equal quantities, or higher concentrations of the first particles 402 of the first material 112 when compared to the second particles 410 of the second material 116, and the first particles 402 of the first material 112 may represent between about 25% and about 75% (e.g., about 40%, about 50%, about 60%) by weight of the slurry or paste dispensed to form the transition region 502 of the first second intermediate product 500. In some embodiments, the distribution of the second particles 410 including the second material 116 and the first particles 402 including the first material 112 may be configured to produce a gradient in material properties between the first region 110 (see FIG. 1) and the sensor 102 (see FIG. 1) upon consolidation of the transition region 502 into the transition region 114 (see FIG. 1).

In some embodiments, placing the second particles 410 including the second material 116 may also involve placing third particles 412 including a third material 118 on or above the support surface 404. For example, the 3D-printer 406 may dispense a slurry or paste including the third particles 412 including the third material 118 configured to mitigate the effects of radiation and/or corrosion interspersed with the second particles 410 including the second material 116 and the first particles 402 including the first material 112 within the transition region 502. Such a slurry may primarily include some combination of the first particles 402 of the first material 112 and the second particles 410 of the second material 116, and the third particles 412 of the third material 118 may represent about 25% or less by weight (e.g., between about 1% and about 10% by weight) of the slurry or paste within the transition region 502.

In some embodiments, placing the first particles 402 including the first material 112 and the second particles 410 including the second material 116 may also involve placing fourth particles 414 including a fourth material 120 on or above the support surface 404. For example, the 3D-printer 406 may dispense a slurry or paste including the fourth particles 414 including the fourth material 120 of the sensor 102 (see FIG. 1) to be supported by the transition region 502 of the second intermediate product 500 interspersed with the first particles 402 including the first material 112 and the second particles 410 including the second material 116. Such a slurry may primarily include the first particles 402 of the first material 112 and the second particles 410 of the second material 116, and the fourth particles 414 of the fourth material 120 may represent about 25% or less by weight (e.g., between about 1% and about 10% by weight) of the slurry or paste within the transition region 502.

The first region 416 may be distinguishable from the transition region 502 by virtue of differences in their material compositions, and resulting differences in material properties. For example, the first region 416 may have a larger amount (e.g., greater quantity by number count of first particles 402, higher weight percentage, higher concentration, higher density) of the first material 112 and a smaller amount (e.g., lesser quantity by number count of second particles 410, lower weight percentage, lower concentration, lower density) of the second material 116 when compared to the second region 502. Continuing the example, the second region 502 may have a larger amount (e.g., greater quantity by number count of second particles 410, higher weight percentage, higher concentration, higher density) of the second material 116 and a smaller amount (e.g., lesser quantity by number count of second particles 410, lower weight percentage, lower concentration, lower density) of the second material 116. More specifically, the second region 502 may have a coefficient of thermal expansion closer to a coefficient of thermal of a sensor 102 (see FIG. 1) to be supported by the 3D-printed structure ultimately formed from the second intermediate product 500 than the coefficient of thermal expansion of the first region 416 is to the coefficient of thermal of the sensor 102 (see FIG. 1).

Figure 6:
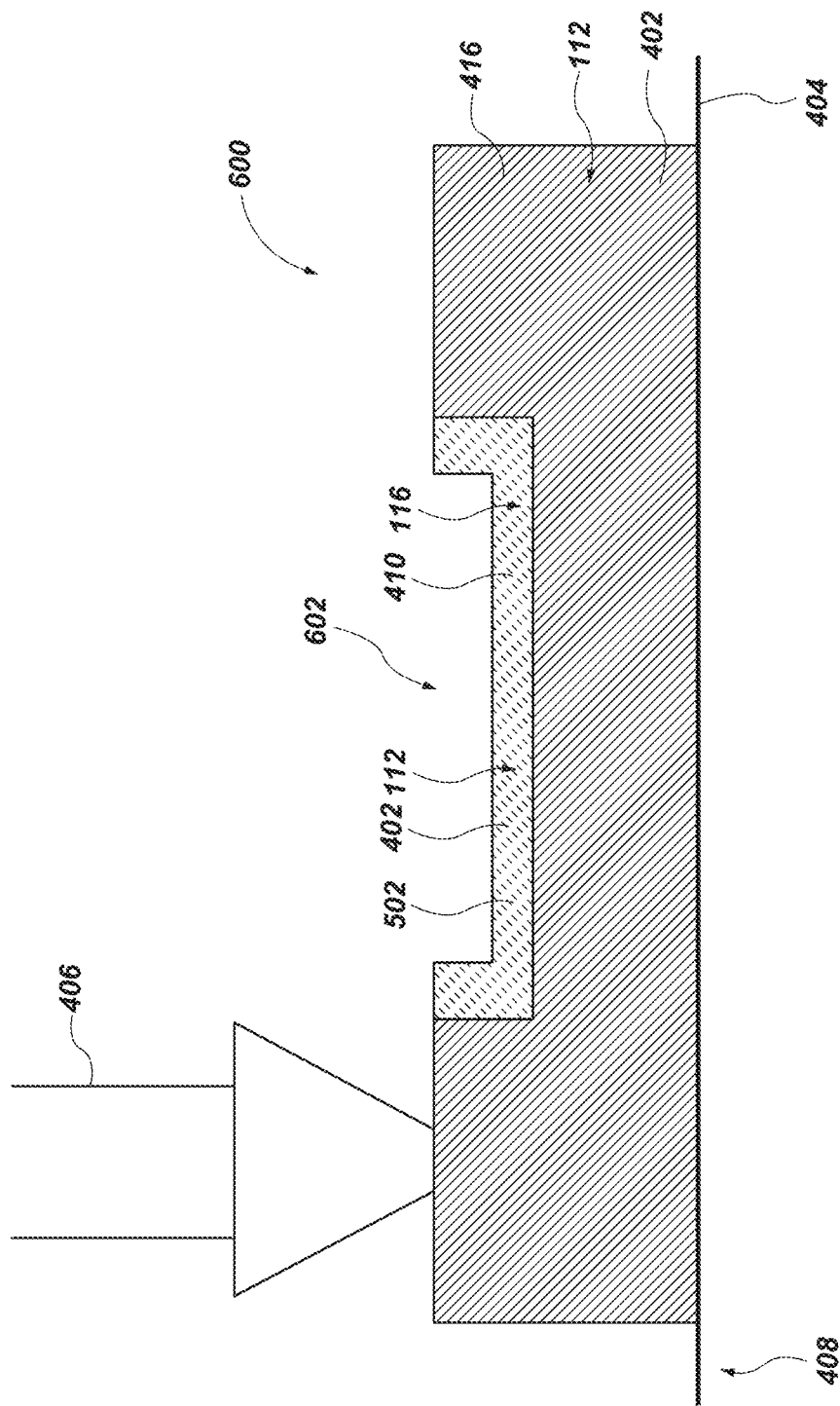
FIG. 6 is a partial cross-sectional side view of a schematic of a third intermediate product in a third stage of the method of FIG. 3.

FIG. 6 is a partial cross-sectional side view of a schematic of a third intermediate product 600 in a third stage of the method 300 of FIG. 3. FIG. 6 omits the third particles 412 and fourth particles 414 from the transition region 502 for the sake of simplicity and convenience in depiction. Such omission does not mean that such optional materials are lacking from the particles and materials combined with the first particles 402 of the first material 112 and the second particles 410 of the second material 116 to form the transition region 502, or that an embodiment wholly separate from that of FIGS. 4 and 5 is depicted in FIG. 6.

The mixture of the second particles 410 including the second material 116 and the first particles 402 including the first material 112 may continue to be placed above the support surface 404, and above underlying portions of the first region 416 and the transition region 502 to complete formation of the first region 416 and the transition region 502. In some embodiments, such as that shown in FIG. 6, a recess 602 may be formed in the transition region 502 to enable a sensor 102 (see FIG. 1), and optionally a housing 108 (see FIG. 1), to be supported within the recess 602 when forming the transition region 502. For example, the recess 602 may have a shape that is at least substantially a void which the sensor 102 (see FIG. 1) and housing 108 (see FIG. 1) may at least substantially fill, particularly upon consolidation of the third intermediate product 600 and densification into a final structure 100 (see FIG. 1).

Figure 7:
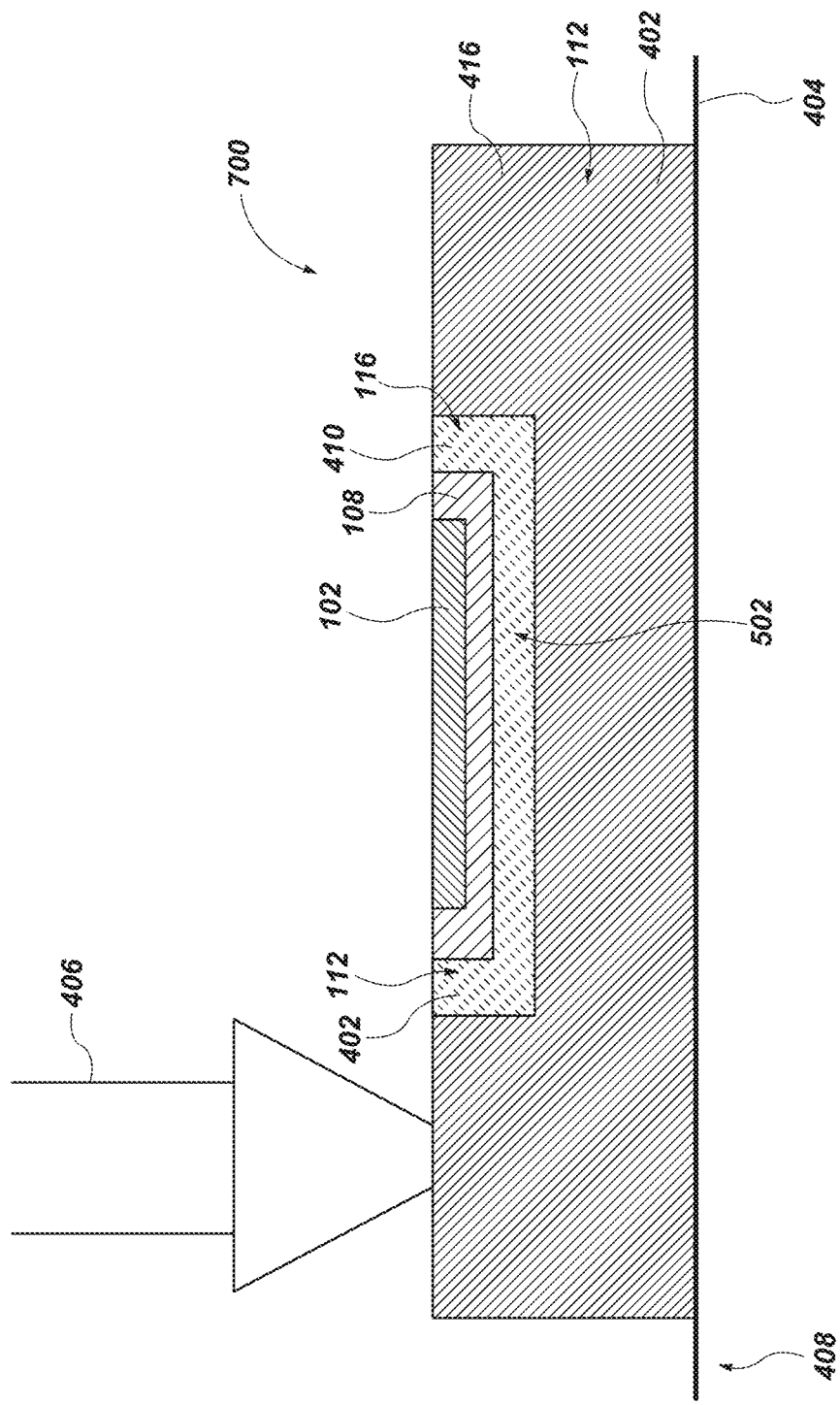
FIG. 7 is a partial cross-sectional side view of a schematic of a fourth intermediate product in a fourth stage of the method of FIG. 3.

FIG. 7 is a partial cross-sectional side view of a schematic of a fourth intermediate product 700 in a fourth stage of the method 300 of FIG. 3. With combined reference to FIG. 3 and FIG. 7, a sensor 102 may be placed in the location of its intended receipt, such as within the recess 602 in some embodiments, as indicated at act 306. For example, a preformed sensor 102 and associated preformed housing 108 may be supported by the transition region 114 of the fourth intermediate product 700 within the recess 602, which may be sized and shaped specifically to accommodate the sensor 102 and housing 108. In other embodiments, precursor materials for the sensor 102, the housing 108, or both (e.g., particles including the fourth material 120, the fifth material 124, and/or any of the combinations of materials discussed previously herein) may be placed on or above the support surface 404 of the platform 408 utilizing the 3D-printer 406.

The completed fourth intermediate product 700 may be a green part, and the respective particles of the fourth intermediate product 700 may be sintered to form a resulting structure 100. During sintering, the first particles 402 of the first material 112 in the first region 416 may fuse to one another (as well as to any other particles in the first region 416), and the first particles 402 of the first material 112 and the second particles 410 of the second material 116 in the transition region 502 may fuse to one another to form a resulting structure 100 (see FIG. 1) with the sensor 102 supported by the structure 100 (see FIG. 1), as indicated at act 308.

For example, the fourth intermediate product 700 may be exposed to heat, and optionally to pressure, to sinter any discrete particles making up the first region 416, the transition region 502, the housing 108, and the sensor 102 to form the resulting structure 100 with the sensor 102 supported thereby. More specifically, the fourth intermediate product 700 may be exposed to temperatures greater than about 200° C., and optionally a pressure greater than atmospheric pressure, to fuse together any discrete particles making up the first region 416, the transition region 502, the housing 108, and the sensor 102 to form the resulting structure 100 with the sensor 102 supported thereby. As a specific, nonlimiting example, the fourth intermediate product 700 may be exposed to temperatures between about 300° C. and about 1,500° C. (e.g., about 500° C., about 800° C., about 1,000° C.), and optionally a pressure between about 1 kPa and about 3 GPa (e.g., about 1 MPa, about 10 MPa), to fuse together any discrete particles making up the first region 110, the transition region 114, the housing 108, and the sensor 102 to form the resulting structure 100 with the sensor 102 supported thereby.

Methods 300 in accordance with embodiments of this disclosure may enable deployment of sensors 102 closer to, or directly exposed to, regions of interest. For example, 3D-printing the supporting structure around the sensors 102, integrating the sensors 102 into the body of the associated structure, may enable more direct measurement of operating conditions than was previously achievable utilizing sensors deployed in locations distal from the operating environment and inferring actual operating conditions from those sensors. In addition, methods 300 in accordance with embodiments of this disclosure may enable customized protection and material properties of structures deployed in difficult operating environments, such as radioactive and/or corrosive operating environments. For example, the sensors may be protected utilizing more selective distancing from the operating environment, as well as customization of material properties of any materials surrounding the sensors, through more customizable and targeted control over the distribution of materials throughout the supporting structure. Finally, methods 300 in accordance with embodiments of this disclosure may reduce mismatch in material properties between supporting structures and sensors supported thereby, particularly when ceramic materials are included in the supporting structures and the sensors include metals or metal alloys.

Figure 8:
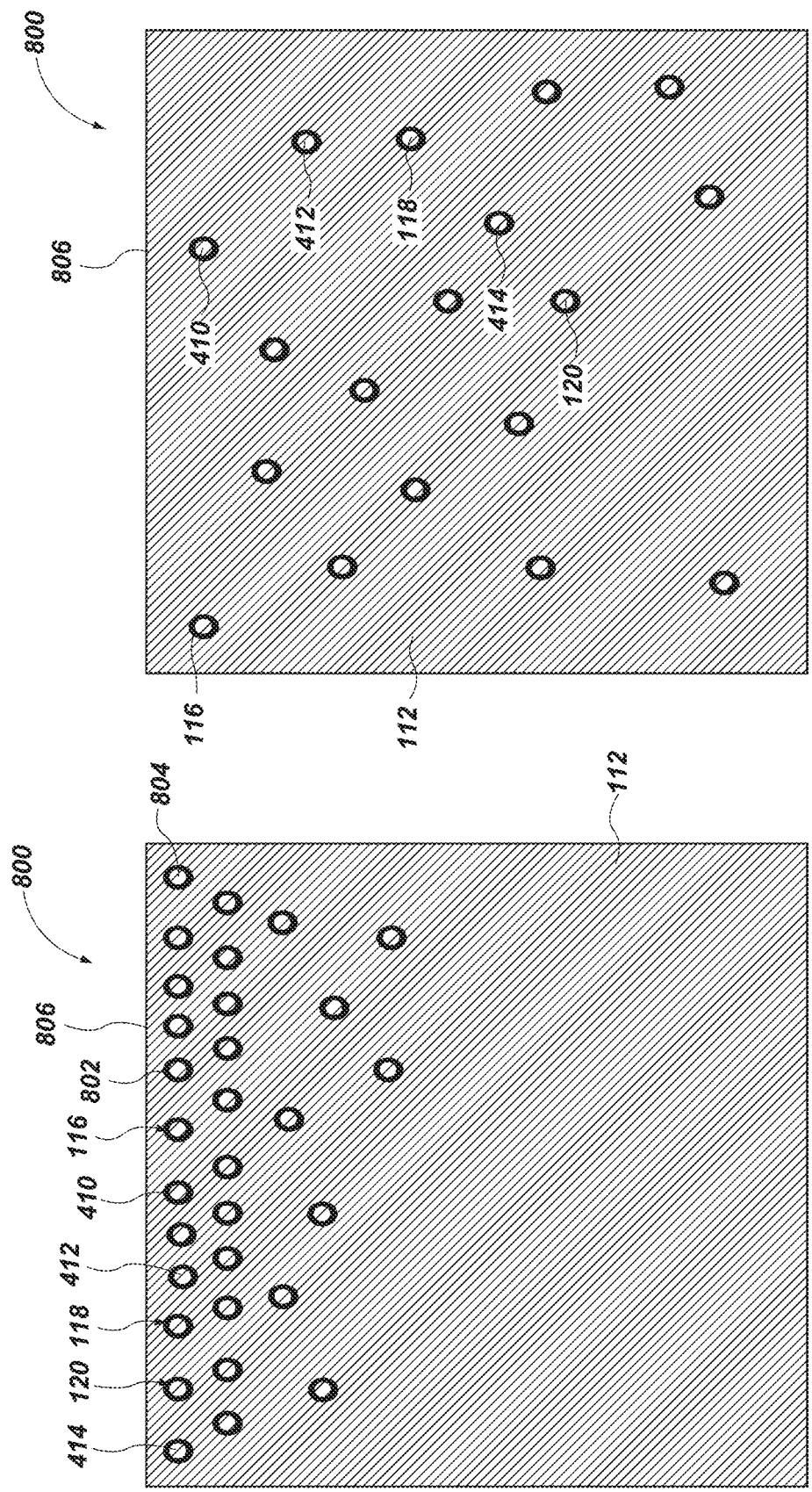
FIG. 8 is a cross-sectional, simplified view of how a material of a sensor in accordance with this disclosure may appear under magnification.

FIG. 8 is a cross-sectional, simplified view of how a cross-section of a transition region 800 in accordance with this disclosure may appear under magnification. For example, a majority of the volume of the transition region 800 may be occupied by the first material 112. Particles of another material may be dispersed among, and interspersed with, regions of the first material 112. More specifically, one or more of second particles 410 of the second material 116, third particles 412 of the third material 118, or fourth particles 414 of the fourth material 120 may be surrounded by, and disposed within, a larger, at least substantially continuous region of the first material 112. The first material 112 of the transition region 800 may include, for example, a metal, metal alloy, or ceramic material. The second material 116, the third material 118, and/or the fourth material 120 may include, for example, a metal, metal alloy, or ceramic material. The second material 116, the third material 118, and/or the fourth material 120 may be, for example, the same as the material for a first region 110 (see FIG. 1) of a structure 100 (see FIG. 1) at least partially surrounding the transition region 800 and affixing the transition region 800 to another component, the same as the material of the component itself, or a transition material having a value for at least one material property intermediate the values of the corresponding material properties of the first material 112 and an immediately adjacent material (e.g., the material of the sensor 102 (see FIG. 1)).

In some embodiments, one or more of the second particles 410, third particles 412, and/or fourth particles 414 may include a core particle 804 of the relevant second material 116, third material 118, and/or fourth material 120 and a coating 802 (also characterized herein as a "casing") of still another material. The coating 802 may include, for example, a metal, metal alloy, or ceramic material. The coating 802 may include any of the first materials 112, the second material 116, the third materials 118, and/or the fourth materials 120 described previously.

In some embodiments, the second particles 410, third particles 412, and/or fourth particles 414 may be segregated in one or more portions of the transition region 800, with other portions of the transition region 800 being occupied to a greater extent (e.g., exclusively) by the first material 112, as shown on the left-hand side of FIG. 8 (when viewed in landscape orientation). For example, the second particles 410, third particles 412, and/or fourth particles 414 may be concentrated proximate to a major surface 806 of the transition region 800. More specifically, the second particles 410, third particles 412, and/or fourth particles 414 may be primarily located proximate to the major surface 806 exposed to the operating environment where an associated sensor 102 (see FIG. 1) will be deployed. In other embodiments, the second particles 410, third particles 412, and/or fourth particles 414 may be dispersed substantially homogeneously throughout the first material 112 of the transition region 800, as shown on the right-hand side of FIG. 8 (when viewed in landscape orientation).

Figure 9:
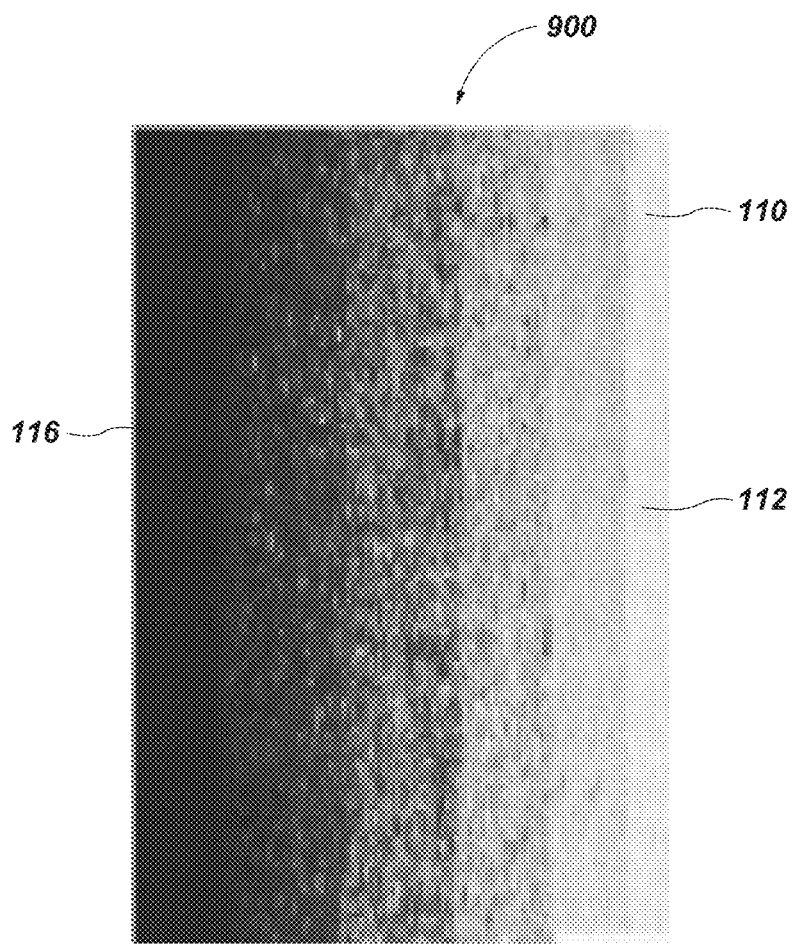
FIG. 9 is a cross-sectional view of a photomicrograph of how a material of a sensor, a base, and a transition region between the sensor and the base may appear under magnification.

FIG. 9 is a cross-sectional view of a photomicrograph of how a material of a first region 110, and a transition region 900 between the first region 110 and an associated sensor 102 (see FIG. 1) may appear under magnification. For example, the transition region 900 may include a gradient in material properties between the first material 112 of the first region 110 and the material of the sensor 102 (see FIG. 1) utilizing the distribution of the second material 116. More specifically, the transition region 900 may be interposed between the sensor 102 (see FIG. 1) and the first region 110 and may include gradually changing volume percentages of the second material 116 of the transition region 900 and of the first material 112 of the first region 110. As a specific, nonlimiting example, the transition region 900 may include a highest concentration of the second material 116, and a lowest concentration of the first material 112 proximate to the sensor 102 (see FIG. 1) and a lowest concentration of the second material 116, and a highest concentration of the first material 112, proximate to the first region 110, with gradual changes in concentration of each of the second material 116 and the first material 112 across the transition region 900 from the sensor 102 (see FIG. 1) to the first region 110. The changes in concentration may be distinct with detectable boundaries from layer to layer in some embodiments. In other embodiments, the changes in concentration may be at least substantially continuous, such that no discernable boundaries may be detectable between respective portions of the transition region 900 and between the transition region 900 and the first region 110.

As another example, the transition region 900 may include alternating layers having different material properties between the second material 116 of the transition region 900 and the first material 112 of the first region 110. For example, the transition region 900 may include a layer of the first material 112 of the first region 110 or the second material 116 adjacent to the sensor 102 (see FIG. 1), a layer of the second material 116 of the transition region 900 adjacent to the first region 110, and alternating layers of the same first material 112 and the second material 116 therebetween.

Figure 10:
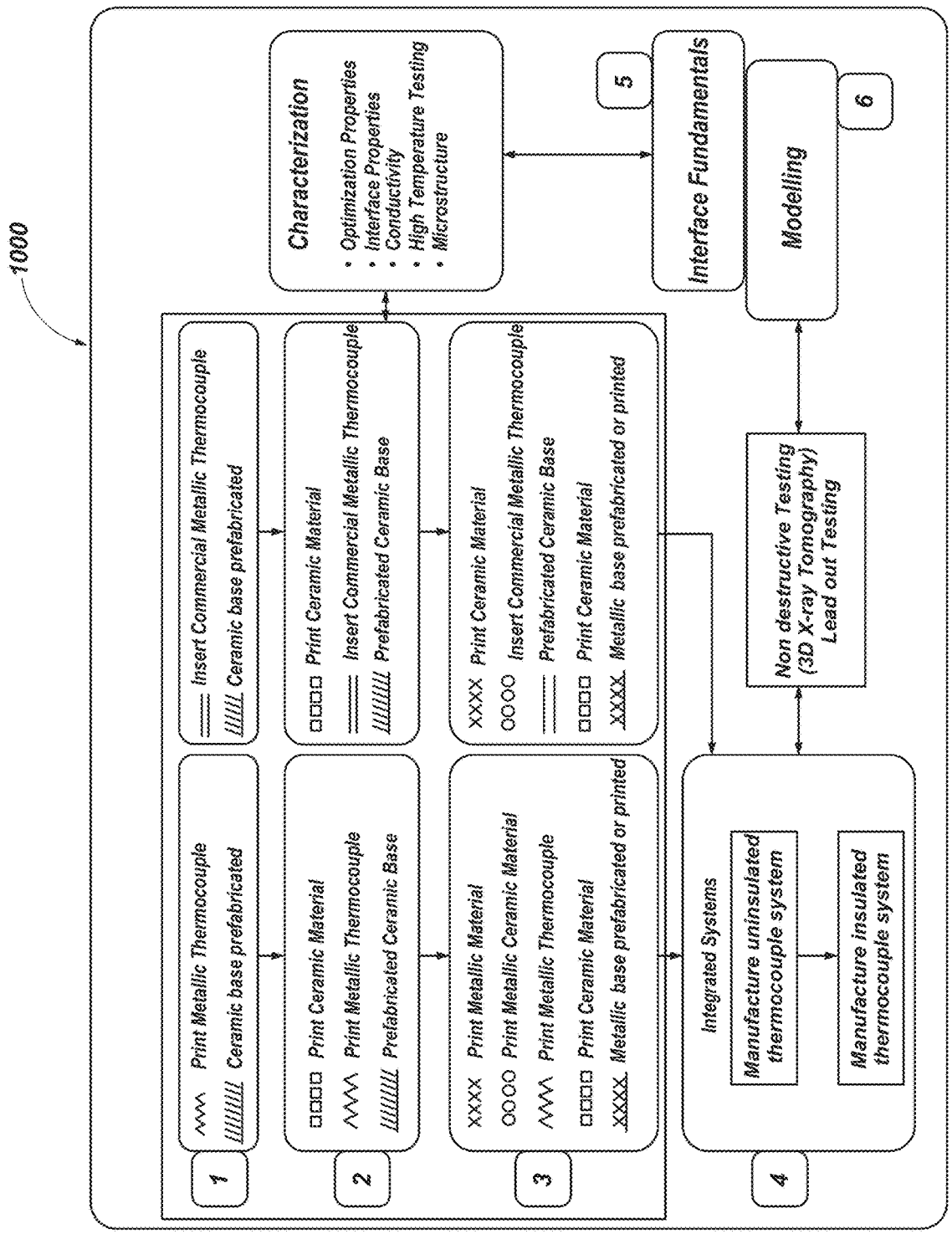
FIG. 10 is a chart illustrating various techniques for forming sensors and structures and incorporating those sensors, structures, and associated systems.

FIG. 10 is a chart 1000 illustrating various techniques for forming sensors and structures and incorporating those sensors, structures, and associated systems. Referring collectively to FIG. 1 and FIG. 10, for example, at least one structure selected from the sensor 102, the first region 110, the transition region 114, and the structure 100 into which the transition region 114 may be incorporated with the first region 110 surrounding at least a portion thereof may be fabricated utilizing additive manufacturing techniques. In some embodiments, one or more of the sensor 102, the first region 110, the transition region 114, and the structure 100 may be a pre-formed, complete part and other(s) of the sensor 102, the first region 110, the transition region 114, and the structure 100 may be formed around, within, or separately from and subsequently affixed to the sensor 102, the first region 110, the transition region 114, and the structure 100.

For example, in a first manufacturing technique of the chart 1000 indicated by the version of box 1 on the left-hand side of FIG. 10, the material of the sensor (a thermocouple in this instance) may be formed by 3D printing techniques, and a ceramic structure (also referred to in chart 1000 as a "base") or housing may be prefabricated. In a second manufacturing technique of the chart 1000 indicated by the version of box 1 in the center column of FIG. 10, the sensor (a thermocouple in this instance) and at least a portion of a ceramic structure or housing may be prefabricated.

As another example, in a third manufacturing technique of the chart 1000 indicated by the version of box 2 on the left-hand side of FIG. 10, the material of the sensor (a thermocouple in this instance) and a ceramic material (in the form of a transition region or a housing) may be formed by additive manufacturing techniques, and a remainder of a ceramic structure may be prefabricated. In a fourth manufacturing technique of the chart 1000 indicated by the version of box 2 in the center column of FIG. 10, the sensor (a thermocouple in this instance) and at least a portion of a ceramic structure may be prefabricated, and a remainder of the ceramic structure (e.g., the transition region) may be formed utilizing additive manufacturing techniques.

As yet another example, in a fifth manufacturing technique of the chart 1000 indicated by the version of box 3 on the left-hand side of FIG. 10, the material of the sensor (a thermocouple in this instance) and a combination of ceramic, metallic, and metallic-ceramic materials (in the form of a transition region and/or or housing) may be formed by additive manufacturing techniques, and a remainder of a metallic structure may be prefabricated. In a sixth manufacturing technique of the chart 1000 indicated by the version of box 3 in the center column of FIG. 10, the sensor (a thermocouple in this instance) and at least a portion of a metallic structure may be prefabricated, and a remainder of the metallic, ceramic, and/or metallic-ceramic materials of the structure (e.g., the transition region) and/or the housing may be formed utilizing additive manufacturing techniques.

Once formed utilizing any of the above techniques, the resulting structure with integrated sensor may be directly deployed in a system, with or without protective materials (e.g., insulation) proximate the structure, as indicated at box 4 of the chart 1000. In addition, the resulting structure with one or more integrated sensors may be characterized for its various properties and performance, and its ability to interface with, and be integrated into a system, may be evaluated, as indicated at box 5 of the chart 1000. In some embodiments, the performance evaluation may be simulated based on the evaluated properties of the structure and sensor, as indicated at box 6, of the chart 1000.

Additive manufacturing may involve, for example, layering particles of the structures to be formed on one another and consolidating the particles to form the structures. More specifically, additive manufacturing may involve sequentially placing quantities of various particles in desired locations to form the desired structure(s) (e.g., the sensor 102, the first region 110, the transition region 114, the structure 100), exposing the particles to heat (and optionally pressure), and sintering the particles to form the structure(s).

In some embodiments, the first particles and any other provided particles may be stirred, increasing surface roughness, before fusing the particles to one another. For example, stirring may be accomplished by mechanically vibrating, exposing to flowing fluid, or exposing to flowing electrical current.

Sensors, structures, and techniques for forming sensors and structures supporting the sensors in accordance with embodiments of this disclosure may enable the sensors to more accurately and directly measure one or more characteristics of an operating environment. For example, sensors, structures, and techniques for forming sensors, structures, and optionally components affixed thereto in accordance with embodiments of this disclosure may have less mismatch and induced stress resulting from any mismatch in coefficients of thermal expansion of the materials of the sensors, structures, and components affixed thereto. As another example, sensors, structures, and techniques for forming sensors, structures, and optionally components affixed thereto in accordance with embodiments of this disclosure may better resist corrosion and provide more accurate measurement in corrosive, irradiated, high-temperature, and otherwise extreme environments.

Among other benefits described herein, sensors, structures, and techniques for forming sensors and supporting structures in accordance with embodiments of this disclosure may enable: (1) increased longevity of heat exchangers; (2) better control over a system in which the sensors and structures are integrated; (3) collection of more data without disturbing the flow in an chamber to which sensors are exposed; (4) collection of more accurate, hard-to-obtain data; (5) expanded additive manufacturing capabilities and in-pile instrumentation for nuclear applications; and (6) reduction (e.g., prevention) of maintenance or accident conditions.

Among other applications described herein, applications for the sensors, structures, and techniques for forming sensors and supporting structures in accordance with embodiments of this disclosure may include: (1) fabrication of heat transfer components; (2) customized nuclear fuel designs; (3) energy systems; (4) nuclear power plants (large scale, small scale, and micro reactors); (5) aerospace test reactors; and (6) navy ship building and micro reactors.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of placing a sensor in a structure, comprising:
    placing first particles comprising a first material of a structure in a first region and in a transition region proximate to the first region on or above a support surface, the transition region proximate to a location where a sensor is to be supported by the structure;
    dispersing second particles comprising a second, different material among the first particles at least within the transition region, such that a value of at least one material property within the transition region, once fused, is intermediate a first value of the at least one material property within the first region and a fourth value of the at least one material property of the sensor, the second particles exhibiting a coefficient of thermal expansion between a coefficient of thermal expansion of the first particles and a coefficient of thermal expansion of a material of the sensor;
    placing the sensor in the location; and
    fusing the first particles of the first material to one another and to the second particles of the second material to form the structure with the sensor supported by the structure.

2. The method of claim 1, wherein placing the sensor in the location comprises forming the sensor in situ in the location by placing third particles of a material of the sensor in the location and fusing the third particles of the material of the sensor with one another to form the sensor supported by the structure.

3. The method of claim 2, further comprising placing the third particles within a space at least partially defined by fourth particles of a fourth material, the fourth particles interposed between at least some of the third particles and at least some of the first and second particles, and fusing the fourth particles to form a housing comprising a protective material interposed between at least a portion of the sensor and the structure.

4. The method of claim 1, wherein placing the sensor in the location comprises placing a preformed sensor in the location.

5. The method of claim 4, further comprising placing the preformed sensor in a housing comprising a protective material, the housing interposed between the sensor and the first and second particles when the sensor is placed in the location.

6. The method of claim 1, wherein placing the first particles comprising the first material comprises placing first particles comprising a core comprising the first material and a casing comprising the second material or a material of the sensor.

7. The method of claim 1, further comprising dispersing other particles of another material configured to absorb fission products or corrosive products among the first particles of the structure.

8. The method of claim 1, wherein dispersing the second particles among the first particles comprises forming a gradient in the at least one material property, a value of the at least one material property falling between values for corresponding material properties of the first material and a material of the sensor, utilizing a distribution of the second material within the first material.

9. The method of claim 1, wherein dispersing the second particles among the first particles comprises placing alternating layers of the second particles and the first particles within the transition region.

10. The method of claim 1, further comprising mixing the first particles and the second particles, increasing surface roughness, before fusing the first particles of the first material to one another and to the second particles of the second material to form the structure with the sensor supported by the structure.

11. The method of claim 10, wherein mixing comprises vibrating, exposing to flowing fluid, or exposing to flowing electrical current.

12. A method of placing a sensor in a structure, comprising:
placing first particles comprising a first material of a structure in a first region and in a transition region proximate to the first region on or above a support surface, the transition region proximate to a location where a sensor is to be supported by the structure;
dispersing second particles comprising a second, different material among the first particles at least within the transition region of the structure proximate to a location where a sensor is to be supported by the structure, such that a value of at least one material property within the transition region, once fused, is intermediate a first value of the at least one material property within the first region and a fourth value of the at least one material property of the sensor the second particles exhibiting a coefficient of thermal expansion between a coefficient of thermal expansion of the first particles and a coefficient of thermal expansion of a material of the sensor;
mixing the first particles and the second particles to increase surface roughness of the first particles and the second particles;
placing the sensor in the location; and
fusing the first particles of the first material to one another and to the second particles of the second material after mixing the first particles and the second particles to form the structure with the sensor supported by the structure.

13. The method of claim 12, wherein placing the sensor in the location comprises forming the sensor in situ in the location by placing third particles of a material of the sensor in the location and fusing the third particles of the material of the sensor with one another to form the sensor supported by the structure.

14. The method of claim 12, wherein placing the sensor in the location comprises placing a preformed sensor in the location.

15. The method of claim 14, further comprising placing the preformed sensor in a housing comprising a protective material, the housing interposed between the sensor and the first and second particles when the sensor is placed in the location.

16. The method of claim 15, wherein a material of the housing comprises at least one of depleted uranium, depleted thorium, barium sulfate, a metal oxide, steel, aluminum, aluminum alloy, copper, copper alloy, chrome, chrome alloy, lead, or lead alloy.

17. The method of claim 12, further comprising leaving a portion of the first material and a portion of the sensor exposed after fusing the first particles to one another and to the second particles.

18. The method of claim 12, wherein placing the first particles on or above the support surface comprises placing the first particles on or above a platform comprising the support surface utilizing a 3D-printer.

19. The method of claim 12, wherein fusing the first particles to one another and to the second particles comprises exposing the first particles and the second particles to heat to sinter the first particles to one another and to the second particles.

* * * * *